United States Patent
Matsumoto et al.

(10) Patent No.: US 8,149,005 B2
(45) Date of Patent: Apr. 3, 2012

(54) JIG FOR DETECTING POSITION

(75) Inventors: Toshiyuki Matsumoto, Hyogo (JP); Tomohide Minami, Hyogo (JP); Yuichi Douki, Kumamoto (JP); Koji Mahara, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 884 days.

(21) Appl. No.: 12/182,239

(22) Filed: Jul. 30, 2008

(65) Prior Publication Data

US 2009/0033908 A1 Feb. 5, 2009

(30) Foreign Application Priority Data

Aug. 2, 2007 (JP) ................................. 2007-201533

(51) Int. Cl.
*G01R 31/00* (2006.01)
*G01R 31/312* (2006.01)

(52) U.S. Cl. .............................. 324/750.16; 324/750.17

(58) Field of Classification Search ........................ None
See application file for complete search history.

(56) References Cited

U.S. PATENT DOCUMENTS

| | | | |
|---|---|---|---|
| 4,686,531 A * | 8/1987 | Shambroom et al. | 324/660 |
| 6,244,121 B1 | 6/2001 | Hunter | |
| 6,468,816 B2 * | 10/2002 | Hunter | 438/14 |
| 6,959,255 B2 * | 10/2005 | Ye et al. | 702/117 |
| 7,171,334 B2 * | 1/2007 | Gassner | 702/182 |
| 7,283,255 B2 * | 10/2007 | Ramsey et al. | 356/620 |
| 7,321,299 B2 * | 1/2008 | Verrier et al. | 340/521 |
| 2002/0078770 A1 | 6/2002 | Hunter | |
| 2004/0222803 A1 | 11/2004 | Tartagni | |

FOREIGN PATENT DOCUMENTS

| | | |
|---|---|---|
| JP | 2003-243479 | 8/2003 |
| WO | 03067183 A2 | 8/2003 |
| WO | 03067183 A3 | 8/2003 |
| WO | 2006133039 A2 | 12/2006 |
| WO | 2006133039 A3 | 12/2006 |

OTHER PUBLICATIONS

European Search Report for EP 08013778 dated Oct. 10, 2008.

* cited by examiner

*Primary Examiner* — Vinh Nguyen (74) *Attorney, Agent, or Firm* — Pearne & Gordon LLP (57) ABSTRACT

A position alignment of a transfer point of a transfer arm is performed by using a position detecting wafer capable of being loaded into an apparatus having a thin transfer port. The position detecting wafer S includes an electrostatic capacitance detecting sensor 50 for detecting an electrostatic capacitance in relation with a reference object for the position alignment. The electrostatic capacitance detecting sensor 50 includes a plurality of electrostatic capacitance detecting electrodes 52, each forming the electrostatic capacitance in relation with the reference object; and a control circuit 51 for controlling a detection of the electrostatic capacitance by each electrostatic capacitance detecting electrode 52, while communicating with each electrostatic capacitance detecting electrode 52. The electrostatic capacitance detecting electrodes 52 are provided on a rear surface of the position detecting wafer S, and the control circuit 51 is provided on a front surface of the position detecting wafer S.

13 Claims, 9 Drawing Sheets

JIG FOR DETECTING POSITION

FIELD OF THE INVENTION

The present disclosure relates to a position detecting jig for performing a position alignment of a transfer point of a transfer arm holding and transferring a substrate.

BACKGROUND OF THE INVENTION

For example, in a manufacturing process of semiconductor devices, a photolithography process is performed by a coating and developing system including a plurality of apparatuses such as a resist coating apparatus, a developing apparatus, a heat treating apparatus and the like. The coating and developing system has a transfer mechanism for transferring a wafer to each of the apparatuses.

The transfer mechanism has a transfer arm for holding the wafer thereon, and, for example, the transfer arm moves three-dimensionally in forward-backward, left-right, and up-down directions to transfer the wafer to each apparatus.

However, in case that the wafer is not transferred to a preset position in each apparatus, the delivery of the wafer or processing of the wafer may not be performed properly, for example. For this reason, when starting the coating and developing system, for example, it is checked whether or not the transfer arm has transferred the wafer to the preset position. In the event that the wafer is not transferred to the right position, the transfer point of the transfer arm is adjusted.

Patent Document 1 discloses an example method for adjusting the transfer position, wherein the method involves the steps of holding a trajectory-detecting wafer having a CCD camera by the transfer arm; transferring the trajectory-detecting wafer by the transfer arm; and detecting a transfer stop position of the transfer arm by the CCD camera.

[Patent Document 1] Japanese Patent Laid-open Publication No. 2003-243479

However, an optical apparatus such as the CCD camera needs to have a sufficient thickness in a vertical direction due to the necessity of an adjusting mechanism of a focus, a focal length or the like. For this reason, as for an apparatus having a transfer port with a reduced opening size due to the influence of a recent miniaturization, it is impossible to load the trajectory-detecting wafer into the apparatus, and to adjust the position thereof properly, either.

BRIEF SUMMARY OF THE INVENTION

In view of the foregoing, the present disclosure provides a position detecting jig capable of being loaded into an apparatus having a thin transfer port, and, also, capable of properly performing a position alignment of a transfer point of a transfer arm.

In accordance with one aspect of the present invention, there is provided a position detecting jig for performing a position alignment of a transfer point of a transfer arm which holds and transfers a substrate, the jig including: a substrate body transferable by the transfer arm; and an electrostatic capacitance detecting sensor for detecting an electrostatic capacitance in relation with a reference object for the position alignment, wherein the electrostatic capacitance detecting sensor includes: a plurality of electrostatic capacitance detecting electrodes, each forming the electrostatic capacitance between the reference object and the electrostatic capacitance detecting electrode; and a control circuit for controlling a detection of the electrostatic capacitance by each electrostatic capacitance detecting electrode, while communicating with each electrostatic capacitance detecting electrode, wherein the electrostatic capacitance detecting electrodes are provided on a rear surface of the substrate body, and the control circuit is provided on a front surface of the substrate body.

In accordance with the present disclosure, by using the electrostatic capacitance detecting sensor, it is possible to detect the electrostatic capacitance in relation with the reference object; recognize a current position of the transfer point of the transfer arm; and perform the position alignment of the transfer arm based on the current position. Further, since it is possible to make the electrostatic capacitance detecting electrodes and the control circuit of the electrostatic capacitance detecting sensor very thin, the thickness of the position detecting jig can be greatly reduced. For this reason, the position detecting jig can be loaded even into an apparatus having a thin transfer port to thereby perform the position alignment of the transfer point of the transfer arm properly. Further, since the electrostatic capacitance detecting electrodes are installed on the rear surface and the control circuit is installed on the front surface, degree of freedom in selecting the number, position or shape of the electrostatic capacitance detecting electrodes improves. Therefore, by optimally arranging the electrostatic capacitance detecting electrodes for various reference objects, the position alignment can be performed with a higher accuracy.

It is also possible that the substrate body is provided with a plurality of electrical conduction paths perforated from the rear surface to the front surface of the substrate body, and each electrostatic capacitance detecting electrode is connected to the control circuit through the electrical conduction paths.

It may be possible that the plurality of electrical conduction paths are formed in a peripheral portion of the substrate body.

It may be possible that the plurality of electrical conduction paths are arranged annularly in the peripheral portion of the substrate body, and the electrostatic capacitance detecting electrodes are disposed in a central portion of the rear surface of the substrate body in comparison with the electrical conduction paths, and wirings connecting the electrostatic capacitance detecting electrodes with the electrical conduction paths are formed in the rear surface of the substrate body in a radial pattern.

It may be possible that an amplifier circuit for amplifying a signal of the electrostatic capacitance detected by the electrostatic capacitance detecting electrode is provided on each wiring connecting each electrostatic capacitance detecting electrode with the control circuit, and the amplifier circuit is disposed on the front surface of the substrate body.

It may be possible that each wiring, connecting each electrostatic capacitance detecting electrode with the amplifier circuit, and each of the electrostatic capacitance detecting electrodes are covered with a guard wiring which can be maintained at the same potential as that of the wiring or the electrostatic capacitance detecting electrode.

It may be possible that the front surface of the substrate body is provided with a wireless circuit communicating between an external controller for performing the position alignment of the transfer arm and the control circuit.

It may be possible that the electrostatic capacitance detecting electrodes are also provided at a position supported by the transfer arm on the rear surface of the substrate body.

It may be possible that the electrostatic capacitance detecting electrodes are formed by a photolithography process or by a screen printing process.

It may be possible that the rear surface of the substrate body is provided with a protective film made of an insulating material to cover the electrostatic capacitance detecting electrodes.

It may be possible that disposed in the transfer point of the transfer arm is a rotation maintenance unit for holding and rotating the substrate body, and installed on a center portion of the front surface of the substrate body is an acceleration sensor for measuring acceleration in the center portion of the substrate body while the substrate body is being rotated by the rotation maintenance unit. Further, it may be possible that the front surface of the substrate body is provided with a humidity sensor for measuring humidity of an atmosphere around the substrate body. Furthermore, it may be possible that the front surface of the substrate body is provided with a temperature sensor for measuring temperature of an atmosphere around the substrate body.

In accordance with the present disclosure, it is possible to load the position detecting jig even into the apparatus having the thin transfer port, and to properly perform the position alignment of the transfer point of the transfer arm.

BRIEF DESCRIPTION OF THE DRAWINGS

The disclosure may best be understood by reference to the following description taken in conjunction with the following figures.

DETAILED DESCRIPTION OF THE INVENTION

Figure 1:
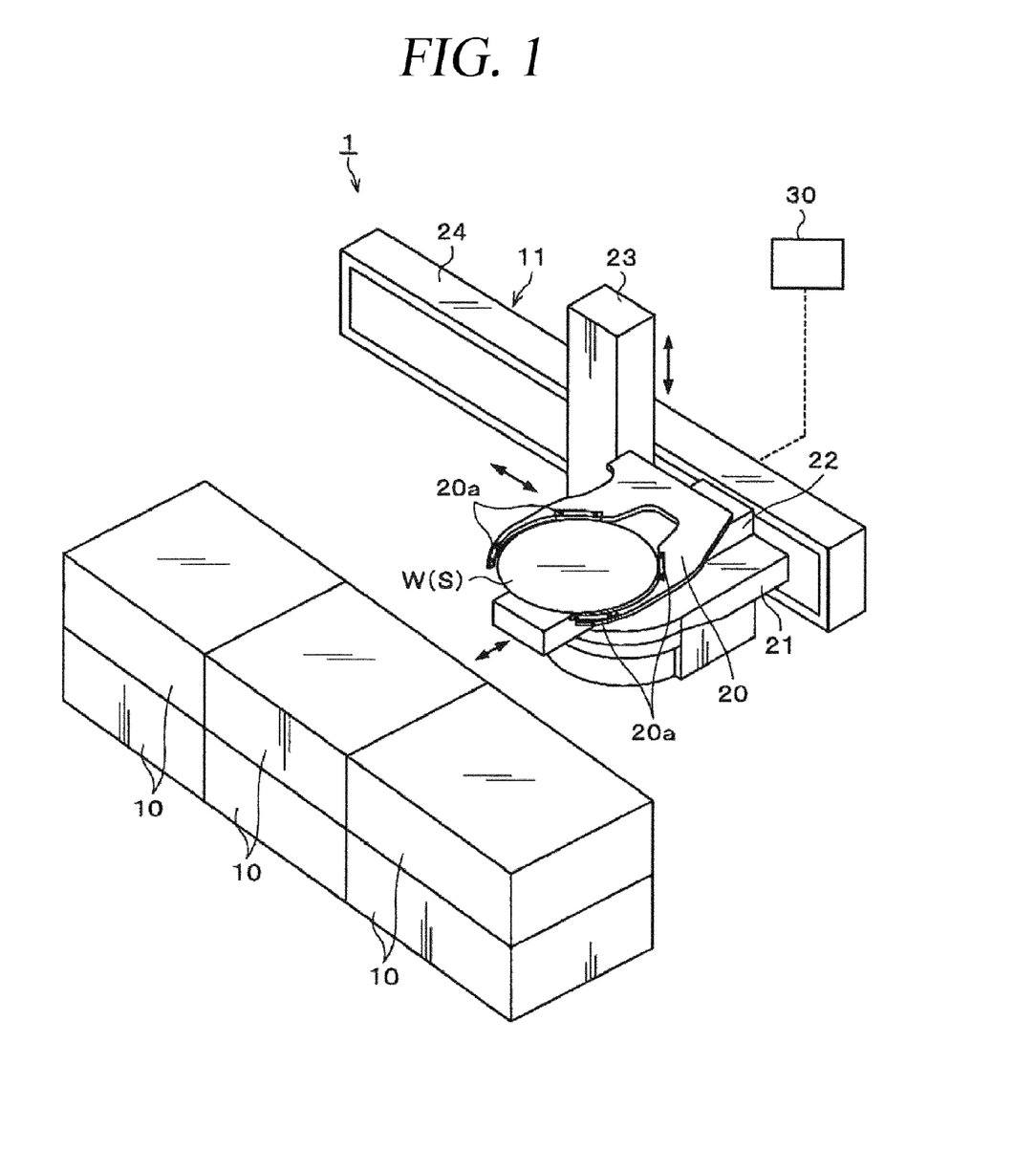
FIG. 1 provides a schematic view of a substrate processing system.

Hereinafter, an embodiment of the present invention will be described in detail with reference to the accompanying drawings. FIG. 1 provides a schematic configuration view of a substrate processing system 1 to which a position detecting wafer is applied as a position detecting jig in accordance with the embodiment of the present invention.

For example, the substrate processing system 1 includes a plurality of processing apparatuses 10 for processing a wafer W and a transfer mechanism 11 for transferring the wafer W to the processing apparatuses 10.

For example, the transfer mechanism 11 has a transfer arm 20. The transfer arm 20 has a front end substantially having, for example, a C shape. A plurality of supporting portions 20a is installed at inner portions of the C-shaped part of the transfer arm 20, and the wafer W can be sustained on these supporting portions 20a. The transfer arm 20, for example, can move back and forth along a rail 22 installed on a base 21. For example, the base 21 is attached to a rail 23 extending in vertical direction, and the rail 23 is attached to a rail 24 extending in left and right directions. With this structure, the transfer arm 20 can move three-dimensionally in forward and backward, left and right, and up and down directions. Therefore, while supporting the wafer W by the transfer arm 20, the transfer mechanism 11 advances the transfer arm 20 into each processing apparatus 10 and transfers the wafer W to a preset position within the processing apparatus 10.

Furthermore, the transfer position of the wafer W by the transfer arm 20 is controlled by an external controller 30 which controls the movement of the transfer arm 20.

Figure 2A:
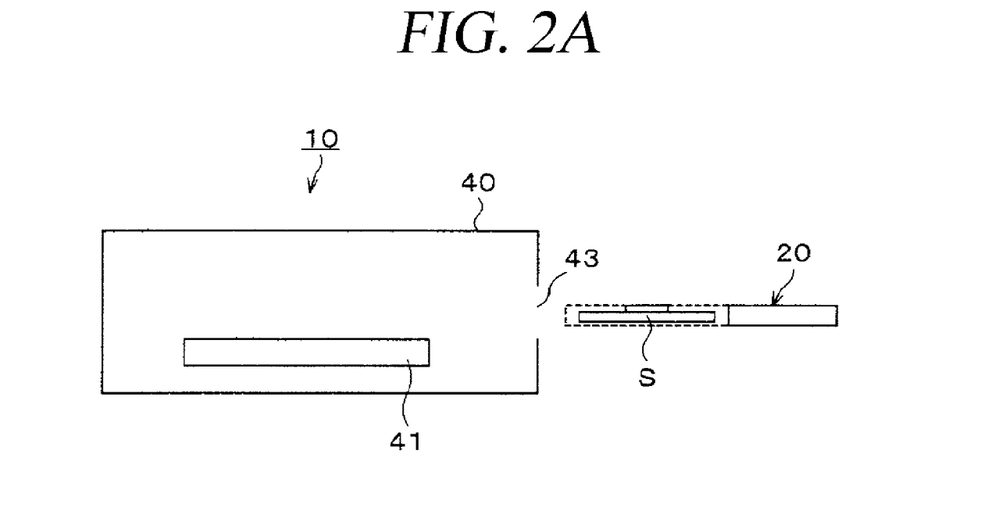
FIGS. 2A and 2B provide a side view and a plan view to illustrate a schematic configuration of a processing apparatus, respectively.
Figure 2B:
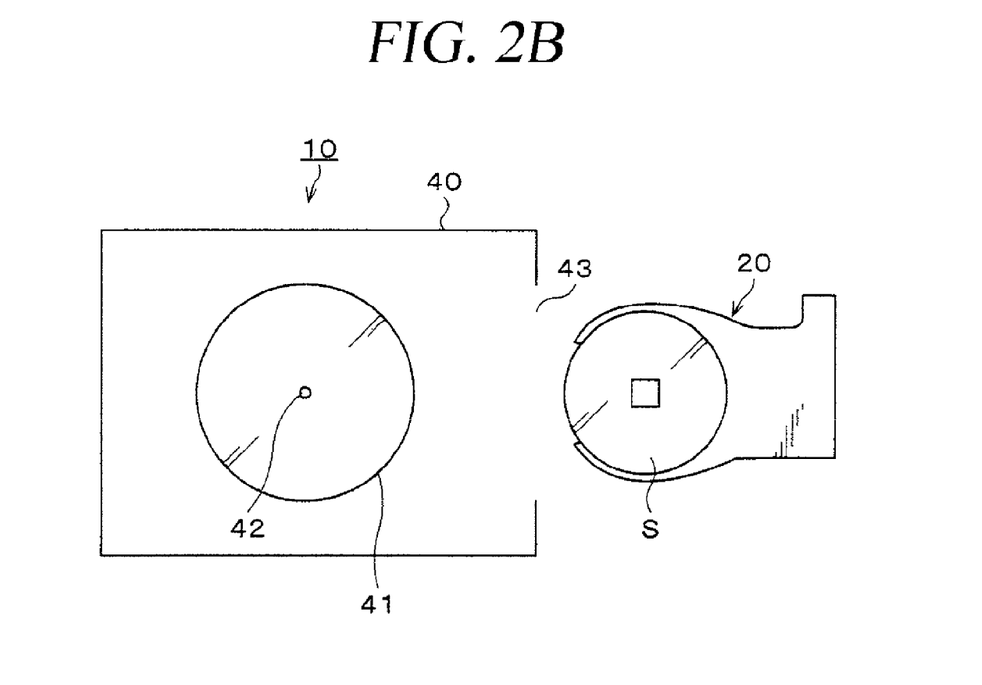

The processing apparatus 10 includes, for example, a mounting table 41 for mounting the wafer W thereon in a processing chamber 40 as illustrated in FIG. 2A. For example, as illustrated in FIG. 2B, a central hole 42 is provided on a center portion of the top surface of the mounting table 41 to be used as a reference object for position alignment. In this embodiment, for example, a proper transfer position of the wafer W is the center portion of the mounting table 41, and the wafer W needs to be transferred so that its center aligns with the central hole 42. Further, a transfer port 43 through which the wafer W is loaded and unloaded by the transfer arm 20 is provided in a sidewall of the processing chamber 40.

Figure 3:
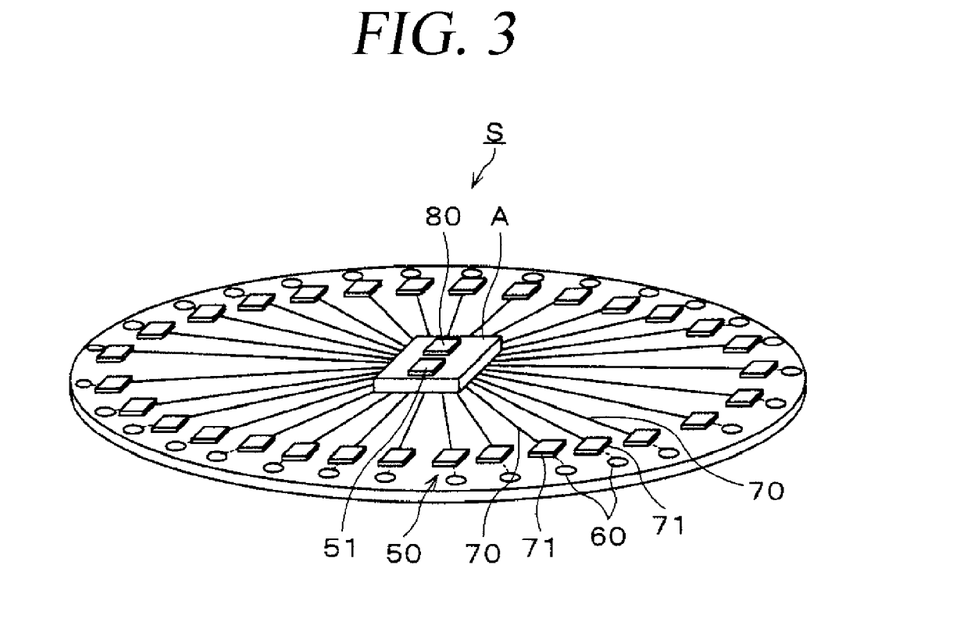
FIG. 3 presents a perspective view of a position detecting wafer.

Now, the structure of a position detecting wafer S will be explained. FIG. 3 is a perspective view of the position detecting wafer S. The position detecting wafer S may be formed in the same shape and size as the product wafer W, for example, and can be transferred by the transfer arm 20. The position detecting wafer S is made of, for example, ceramic, silicon or resin in which a wiring pattern or a hole can be easily formed.

The position detecting wafer S is provided with an electrostatic capacitance detecting sensor 50 for detecting an electrostatic capacitance between the reference object for position alignment and the wafer S. The electrostatic capacitance detecting sensor 50 has a control circuit 51 on the front surface of the wafer S and has a plurality of electrostatic capacitance detecting electrodes 52 on the rear surface of the wafer S, as illustrated in FIG. 4.

Figure 4:
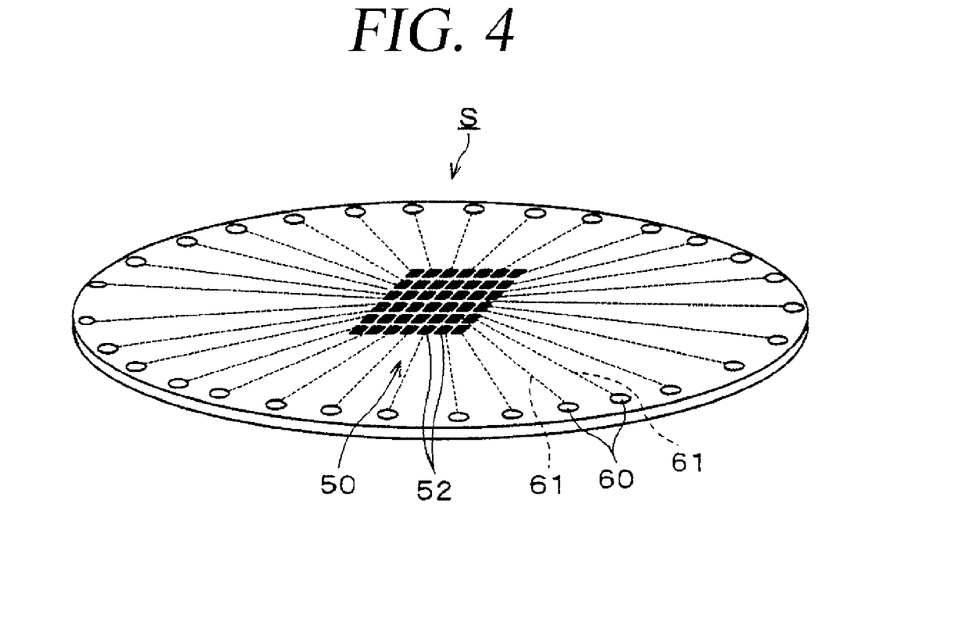
FIG. 4 offers a perspective view of a rear surface of the position detecting wafer.

For example, the electrostatic capacitance detecting electrodes 52 are placed on the center portion of the position detecting wafer S column-wise and row-wise in a grid pattern as illustrated in FIG. 4. Each electrostatic capacitance detecting electrode 52 is, for example, rectangular-shaped and has a diameter, for example, less than that of the reference object (the central hole 42 in this embodiment) which generates the electrostatic capacitance. Also, the interval between the neighboring electrostatic capacitance detecting electrodes 52 is smaller than the diameter of the central hole 42.

In the peripheral portion of the position detecting wafer S, there is provided a plurality of electrical conduction paths 60 which is vertically perforated from the rear surface to the front surface of the wafer. These electrical conduction paths 60 are arranged annularly in the peripheral portion of the position detecting wafer S. Each electrostatic capacitance detecting electrode 52 is connected to corresponding one of the electrical conduction paths 60 via a wiring 61 extended in diametric direction of the position detecting wafer S. That is, a plurality of wirings 60 connecting the electrostatic capacitance detecting electrodes 52 to the electrical conduction paths 60 is formed on the rear surface of the position detecting wafer S in a radial pattern.

Figure 5:
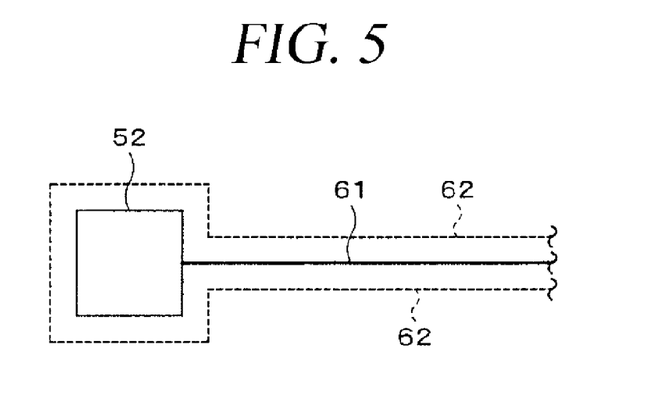
FIG. 5 illustrates an electrostatic capacitance detecting electrode and a wiring covered with a guard wiring.

Each wiring 61 and each electrostatic capacitance detecting electrode 52 are surrounded by a guard wiring 62 as illustrated in FIG. 5. Further, the wiring 61 is extended to a portion in the front surface of the position detecting wafer S, and the portion is also surrounded by the guard wiring 62. For example, the guard wiring 62 is controlled by the control circuit 51 to have the same potential as that of the wiring 61 or the electrostatic capacitance detecting electrode 52 when detecting the electrostatic capacitance. Therefore, it is possible to block an external electric field or the like with respect to an electrical signal transmitted through the wiring 61 or the electrostatic capacitance detecting electrode 52, and, thus, a parasitic capacitance can be removed.

The components placed on the rear surface of the position detecting wafer S, such as the electrostatic capacitance detecting electrodes 52, the wirings 61 and the guard wirings 62 are formed by a photolithography process in which film formation, exposure, development and etching are performed repeatedly. Further, since the electrostatic capacitance detecting electrodes 52, the wirings 61 and the guard wirings 62 are formed by the photolithography process, the rear surface of the position detecting wafer S can be formed to be flat.

As illustrated in FIG. 3, a plurality of wirings 70 connecting the electrical conduction paths 60 in the peripheral portion with the control circuit 51 in the center portion of the wafer S is formed on the front surface of the position detecting wafer S in a radial pattern. Each wiring 70 is provided with an amplifier circuit 71 which amplifies a signal of electrostatic capacitance detected by the electrostatic capacitance detecting electrode 52. The amplifier circuits 71 are placed adjacent to the electrical conduction paths 60. The above-described guard wirings 62 are also provided around the wirings 70 between the amplifier circuits 71 and the electrical conduction paths 60.

The control circuit 51 is formed, for example, on a circuit board A installed on the center portion of the position detecting wafer S. The control circuit 51 transceives a signal of voltage or the like to/from each electrostatic capacitance detecting electrode 52 and detects an electrostatic capacitance generated between the electrostatic capacitance detecting electrode 52 and the reference object. On the circuit board A, a wireless circuit 80 allowing the control circuit 51 to communicate with an external controller 30 wirelessly is installed. In addition, a power supply for the electrostatic capacitance detecting electrodes 52, the control circuit 51, the guard wirings 62 and the wireless circuit 80 and the like is installed at the circuit board A of the position detecting wafer S.

For example, the controller 30 receives an electrostatic capacitance signal of each of the electrostatic capacitance detecting electrodes 52 from the position detecting wafer S, and specifies, based on those electrostatic capacitance signals, the position of the central hole 42, i.e., the reference object with respect to the position detecting wafer S. For example, the controller 30 can specify coordinates of the central hole 42 with respect to the position detecting wafer S based on a previously recognized relationship between the electrostatic capacitance value detected by each electrostatic capacitance detecting electrode 52 and the position of the central hole 42 with respect to the position detecting wafer S.

Figure 6:
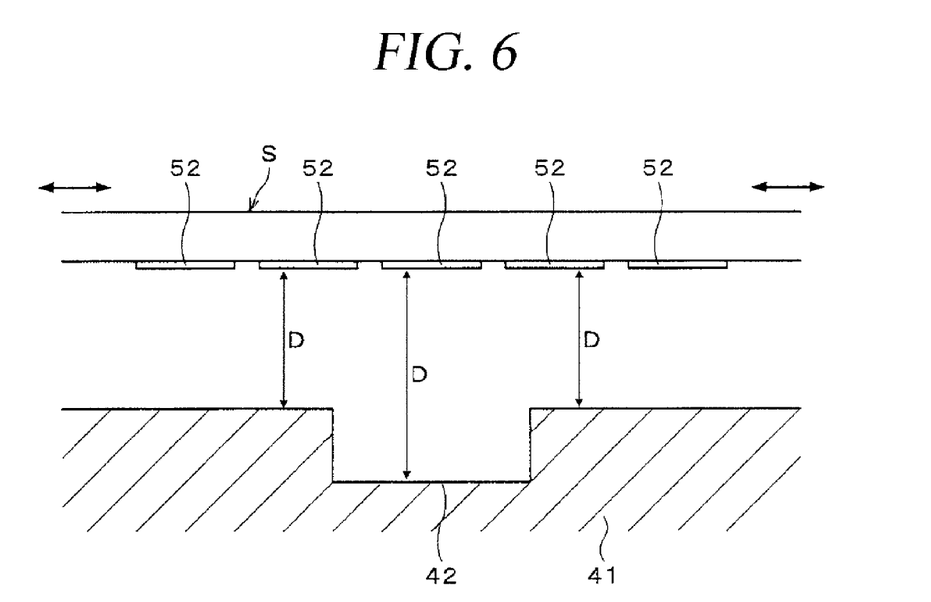
FIG. 6 illustrates distances between electrostatic capacitance detecting electrodes of the position detecting wafer and a front surface of a mounting table.

As illustrated in FIG. 6, if positional relationships between the plurality of electrostatic capacitance detecting electrodes 52 and the central hole 42 are different, a distance D between two poles, i.e., between each electrostatic capacitance detecting electrode 52 and the top surface of the mounting table 41 having the central hole 42 becomes changed, so that an electrostatic capacitance therebetween is varied (electrostatic capacitance (C)=Eo·B/D (Eo represents a dielectric constant between the two poles, and B refers to an area of the electrostatic capacitance detecting electrode)). Based on the relationships, it is possible to specify the position corresponding to the central hole 42 within the position detecting wafer S by detecting the electrostatic capacitance of the plurality of electrostatic capacitance detecting electrodes 52 in the surface of the position detecting wafer S.

Furthermore, the controller 30 calculates an amount of correction required to locate the transfer arm 20 to the proper position based on the specified coordinates of the central hole 42 to thereby adjust the transfer position of the transfer arm 20.

Hereinafter, a process of adjusting the transfer position of the transfer arm 20, which is performed by using the position detecting wafer S having the above-mentioned configuration, will be explained.

Figure 7:
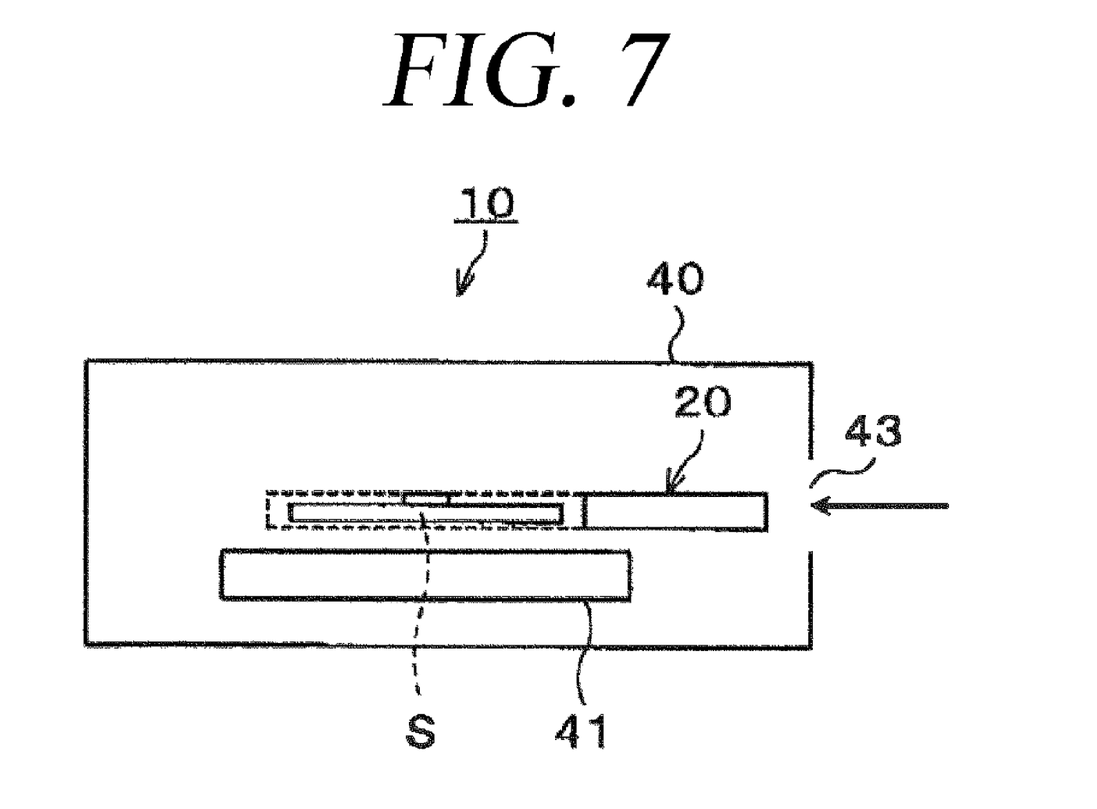
FIG. 7 illustrates a state in which the transfer arm is loaded into the processing apparatus.

First, the position detecting wafer S is held on the transfer arm 20. Next, in accordance with current transfer position set by the controller 30, the transfer arm 20 is advanced into the processing chamber 40 from the transfer port 43 of the processing apparatus 10 and is stopped at a transfer position, i.e., a location above the central portion of the mounting table 41 as illustrated in FIG. 7. After that, according to instructions from the controller 30, the electrostatic capacitance detecting sensors 50 of the position detecting wafer S are operated, so that an electrostatic capacitance generated between each of the electrostatic capacitance detecting electrodes 52 and the top surface of the mounting table 41 having the central hole 42 is detected.

Figure 8:
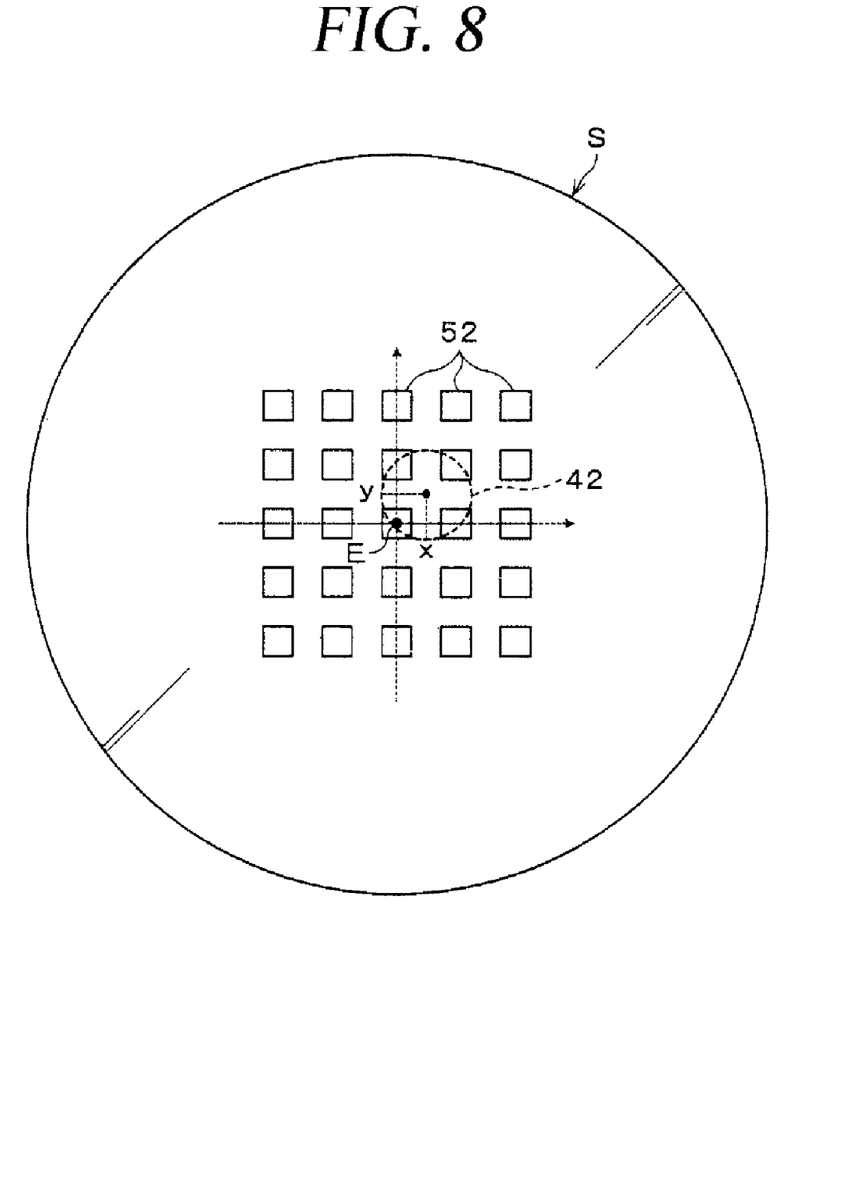
FIG. 8 shows a position of a center hole with respect to the center point of the position detecting wafer.

At this time, an electrostatic capacitance signal detected by each of the electrostatic capacitance detecting electrodes 52 is amplified by the amplifier circuit 71 and then transmitted to the control circuit 51. The control circuit 51 receives the electrostatic capacitance signal from each electrostatic capacitance detecting electrode 52, and these electrostatic capacitance signals are transmitted wirelessly to the controller 30 by the wireless circuit 80. As illustrated in FIG. 8, the controller 30 calculates the coordinates (x, y) of the central hole 42 with respect to the center point E of the position detecting wafer S based on the preset relationship between the electrostatic capacitance value of each electrostatic capacitance detecting electrode 52 and the position of the central hole 42 with respect to the position detecting wafer S.

From the calculated coordinates of the central hole 42, a deviation amount (x, y) between the center point E of the position detecting wafer S and the central hole 42 is calculated, and based on the calculated deviation amount, the transfer position of the transfer arm 20 is adjusted.

In accordance with the above-described embodiment, the position detecting wafer S has the electrostatic capacitance detecting sensor 50, and the plurality of electrostatic capacitance detecting electrodes 52 is installed on the rear surface of the position detecting wafer S, and the control circuit 51 is installed on the front surface thereof. Since this position detecting wafer S uses the electrostatic capacitance detecting electrodes 52 and the control circuit 51, which can be made very thin, instead of using the conventional optical apparatus, the total thickness of the position detecting wafer S can be reduced. Therefore, the position detecting wafer S can be loaded even into a thin type processing apparatus 10 having a narrow transfer port 43, and it is also possible to properly adjust the transfer position of the transfer arm 20 in the processing apparatus 10. Furthermore, since the electrostatic capacitance detecting electrodes 52 are installed on the rear surface and the control circuit 51 is installed on the front surface, it is possible to freely set the number, the shape and the position of the electrostatic capacitance detecting electrodes 52 depending on a reference object for position alignment. Therefore, it is possible to detect the position of the reference object with a high accuracy, which in turn makes it possible to adjust the position of the transfer arm 20 with a high accuracy.

Meanwhile, if the control circuit and the electrostatic capacitance detecting electrodes were installed on the same surface, an electric field generated by the control circuit would affect an electric field around the electrostatic capacitance detecting electrodes. In accordance with the present embodiment, however, since the control circuit 51 and the electrostatic capacitance detecting electrodes 52 are installed on the different surfaces, the electric field generated by the control circuit 51 is prevented from affecting the electric field around the electrostatic capacitance detecting electrodes 52, and therefore it is possible to detect the electrostatic capacitance between the electrostatic capacitance detecting electrodes 52 and the reference object with a higher accuracy. As a result, it is possible to carry out the detection of the reference object position by the position detecting wafer S with a higher accuracy. In addition, in the present embodiment, since the amplifier circuit 71 or the wireless circuit 80 is installed on the front surface of the position detecting wafer S, the detection of the reference object position can be carried out with a higher accuracy.

Furthermore, in accordance with the present embodiment, since only the thin electrostatic capacitance detecting electrodes 52 are disposed on the rear surface of the position detecting wafer S while disposing the relatively thick control circuit 51 and so forth on the front surface thereof, a flatness of the entire rear surface of the position detecting wafer S becomes high. Therefore, for example, it becomes easy to horizontally maintain the position detecting wafer S on the transfer arm, and, as a result, the detection of the electrostatic capacitance between the plurality of the electrostatic capacitance detecting electrodes 52 and the reference object can be carried out with a higher accuracy, thereby making it possible to detect the reference object position more stably and accurately.

Furthermore, since the electrical conduction paths 60 are formed in the peripheral portion of the position detecting wafer S, in which hole formation can be carried out easily, it is relatively easy to connect the electrostatic capacitance detecting electrodes 52 on the rear surface with the control circuit 51 on the front surface by wiring. Also, since the electrical conduction paths 60 are annularly formed in the peripheral portion of the position detecting wafer S, and the electrostatic capacitance detecting electrodes 52 are formed in the central portion thereof, and the wirings 61 connecting the electrical conduction paths 60 and the electrostatic capacitance detecting electrodes 52 are formed in the radial pattern, it is possible to properly implement the wiring of the plurality of the electrostatic capacitance detecting electrodes 52. Also, even if the number of the electrostatic capacitance detecting electrodes 52 increases, it is possible to wire them in a relatively simple pattern, so that a great increase of manufacturing costs for the position detecting wafer S can be suppressed.

Since the amplifier circuits 71 are installed on the position detecting wafer S, it is possible to detect even a signal indicating a minute change in the electrostatic capacitance. Therefore, position detection can be performed with a higher accuracy. Furthermore, since the amplifier circuits 71 are installed on the front surface of the position detecting wafer S, freedom in arranging the electrostatic capacitance detecting electrodes 52 on the rear surface is still ensured.

Since the guard wirings 62 are installed around the electrostatic capacitance detecting electrodes 52 and the wirings 61, it is possible to prevent a signal flowing through the wiring 61 or the electrostatic capacitance detecting electrode 52 from being affected by an external electric field, so that parasitic capacitance can be eliminated. As a result, it is possible to detect even a signal indicating a minute change in the electrostatic capacitance, so that position detection can be carried out with a higher accuracy.

Since the wireless circuit 80 is installed on the front surface of the position detecting wafer S, it is possible to wirelessly transmit detection results of the electrostatic capacitance from the electrostatic capacitance detecting sensor 50 to the controller 30. Also, it is possible to wirelessly transmit operation instructions from the controller 30 to the position detecting wafer S. Therefore, it is possible to perform the position alignment without having to consider, for example, wiring of the transfer arm 20 which transfers the wafer W to a narrow space.

In the above-described embodiment, since the electrostatic capacitance detecting electrodes 52 in the rear surface of the position detecting wafer S are formed by the photolithography process, it is possible to form the electrostatic capacitance detecting electrode 52 very thin. Thus, the flatness of the entire rear surface of the position detecting wafer S improves. Accordingly, for example, it becomes easier to horizontally support the position detecting wafer S on the transfer arm 20. As a result, the detection of the reference object position by the plurality of electrostatic capacitance detecting electrodes 52 can be performed more stably and accurately.

Figure 9:
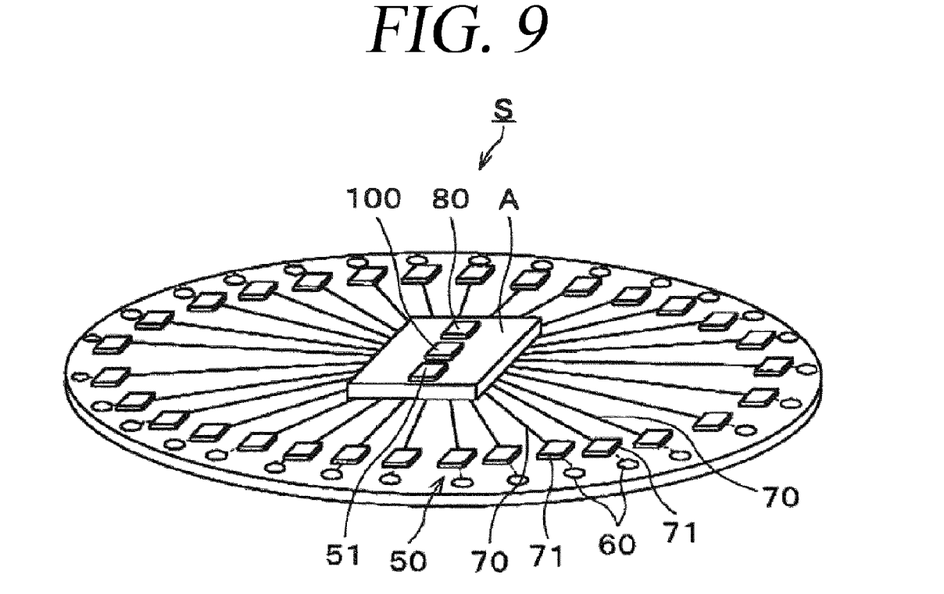
FIG. 9 offers a perspective view of the position detecting wafer provided with an acceleration sensor on a front surface thereof.

Furthermore, since the electrostatic capacitance detecting electrodes 52, the wiring 61 and the guard wiring 62 are all formed by the photolithography process, a flatness of the entire rear surface of the position detecting wafer S becomes higher. With this configuration, for example, it becomes easier to horizontally maintain the position detecting wafer S on the transfer arm 20. As a result, the detection of the reference object position can be performed more stably and accurately. Further, if the flatness of the rear surface of the position detecting wafer S is sufficiently high, it is possible to horizontally maintain the position detecting wafer S even on, for example, a fork-shaped transfer arm which supports the entire rear surface of the position detecting wafer S. Further, the position detecting wafer S is also useful in the case, for example, where the rear surface of the position detecting wafer S is vacuum-attracted. If the processing apparatus 10 to which the position detecting wafer S is transferred is, for example, a resist coating apparatus, a developing apparatus or the like, provided commonly within the apparatus is a spin chuck for vacuum-attracting the rear surface of the position detecting wafer S. Even in this case, since the flatness of the rear surface of the position detecting wafer S is sufficiently high, it is possible for the spin chuck to vacuum-attract the position detecting wafer S horizontally thereto. Furthermore, for example, as illustrated in FIG. 9, while the position detecting wafer S vacuum-attracted to the spin chuck is being rotated, the acceleration in the center portion of the position detecting wafer S can be measured by an acceleration sensor 100 installed thereon and a relative position of the center portion of the position detecting wafer S with respect to the center portion of the spin chuck can be detected. Further, in such case, after detecting the position of the reference object by detecting the electrostatic capacitance through the electrostatic capacitance detecting electrodes 52, the relative position of the center portion of the position detecting wafer S with respect to the center portion of the spin chuck can be successively detected. Therefore, two kinds of the position detection can be carried out by one position detecting wafer S so that it is not necessary for the position detecting wafer S to be loaded and unloaded, and it is possible to drastically shorten an adjusting time of the processing apparatus 10. In accordance with this embodiment, it is possible for the position detecting wafer S to exert advantageous effects especially when the flatness of a specific portion (e.g., the portion vacuum-attracted to the spin chuck as described above) of the rear surface of the position detecting wafer S is required.

Figure 10:
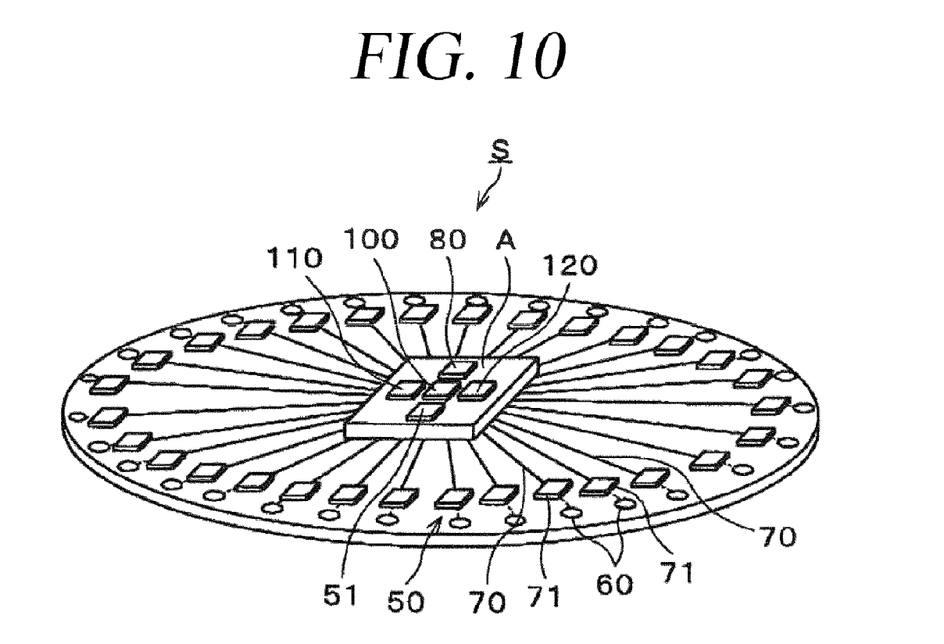
FIG. 10 offers a perspective view of the position detecting wafer provided with the acceleration sensor, a humidity sensor and a temperature sensor on the front surface thereof.

As illustrated in FIG. 10, for example, a humidity sensor 110 may be additionally provided on the front surface of the position detecting wafer S of the above-described embodiment. The humidity sensor 110 is installed on the circuit board A, and is capable of measuring the humidity of the atmosphere around the position detecting wafer S. Here, if the humidity of the atmosphere around the position detecting wafer S is changed, the electrostatic capacitance detected by the electrostatic capacitance detecting electrodes 52 is also changed accordingly. In this embodiment, it is possible to compensate the electrostatic capacitance detected by the electrostatic capacitance detecting electrodes 52 based on the humidity measured by the humidity sensor 110. It may be possible that such compensation is performed by the control circuit 51 of the position detecting wafer S or by the controller 30 after the wireless circuit 80 transmits the humidity measured by the humidity sensor 110 to the controller 30. In such case, for example, even if the humidity of the atmosphere around the position detecting wafer S is changed, it is possible to detect the electrostatic capacitance between the electrostatic capacitance detecting electrode 52 and the reference object more accurately and to detect the position of the reference object more precisely. Further, a temperature sensor 120 may be additionally provided on the front surface of the position detecting wafer S may as illustrated in FIG. 10, for example. The temperature sensor 120 is installed on the circuit board A, and is capable of measuring the temperature of the atmosphere around the position detecting wafer S. Further, it is possible to set an alarm device (not shown) to give an alarm when a specific temperature is measured by the temperature sensor 120, for example. By this setting, if the specific temperature is set to be lower than the temperature where devices such as the control circuit 51 of the position detecting wafer S or the like can be damaged, the devices can be prevented from being damaged by the occurrence of the alarm. Further, in the above-described embodiment, the acceleration sensor 100, the humidity sensor 110 and the temperature sensor 120 are provided on a single position detecting wafer S, but it may be possible to install at least one sensor thereon.

Figure 11A:
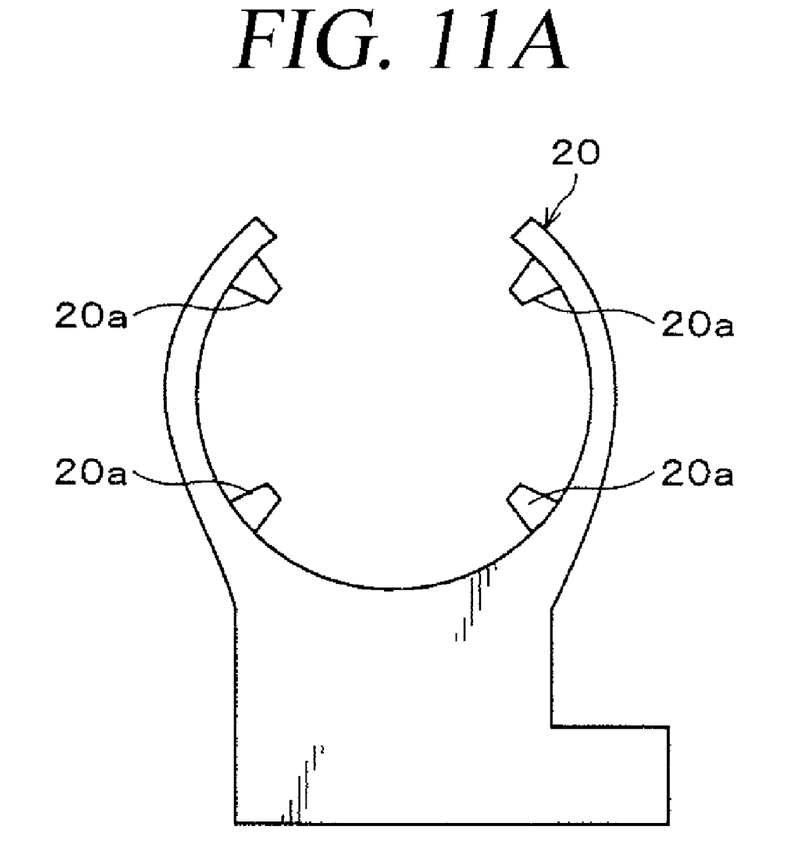
FIG. 11A shows locations of supporting portions of the transfer arm.
Figure 11B:
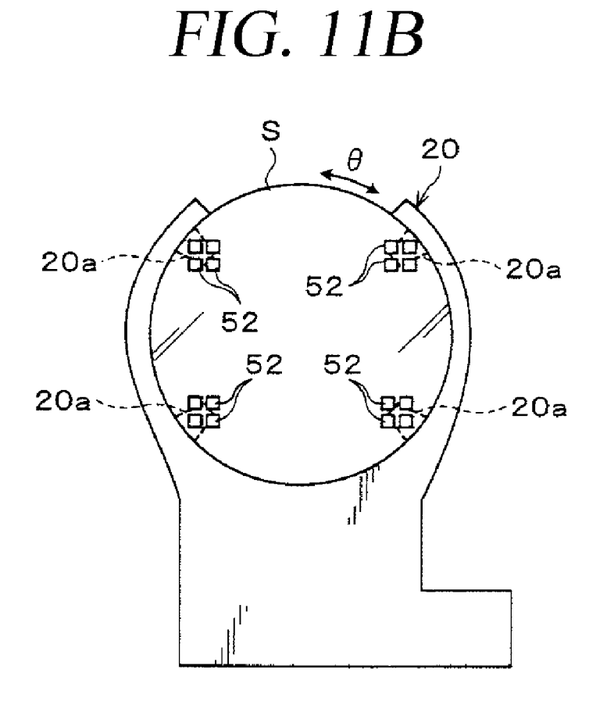
FIG. 11B illustrates locations of electrostatic capacitance detecting electrodes of the position detecting wafer.

In the above-described embodiment, the electrostatic capacitance detecting electrodes 52 on the rear surface of the position detecting wafer S may be also provided at portions in contact with the transfer arm 20 which supports the wafer S. For example, as illustrated in FIG. 11A, when supporting portions 20a of the transfer arm 20 are installed so as to support four peripheral positions of the position detecting wafer S, the electrostatic capacitance detecting electrodes 52 are installed at each of positions corresponding to the supporting portions 20a, as illustrated in FIG. 11B. Further, each of the electrostatic capacitance detecting electrodes 52 is connected with the control circuit 51 on the front surface of the position detecting wafer S as stated above.

In this case, while the position detecting wafer S is being supported by the transfer arm 20 during the position adjustment, for example, the electrostatic capacitance between each of the electrostatic capacitance detecting electrodes 52 and the corresponding one of the supporting portions 20a is detected. Based on the detected electrostatic capacitance, it is determined whether or not the position detecting wafer S is supported by the transfer arm 20 at a proper position and in a proper direction. For example, after the detection value of the electrostatic capacitance is compared to a preset proper value, it is determined whether or not the position detecting wafer S is properly supported on the four supporting portions 20a and whether the direction of the position detecting wafer S in θ direction is proper. Therefore, while adjusting position, it can be checked whether or not the position detecting wafer S is supported by the transfer arm 20 at the proper position and in the proper direction, so that it is possible to check the positional relationship between the position detecting wafer S and the transfer arm 20. As a result, since the position alignment of the position detecting wafer S to the reference object is conducted after its position to the transfer arm 20 is adjusted first, it is possible to detect the position of the transfer point of the transfer arm 20 more accurately by the position detecting wafer S.

Figure 12:
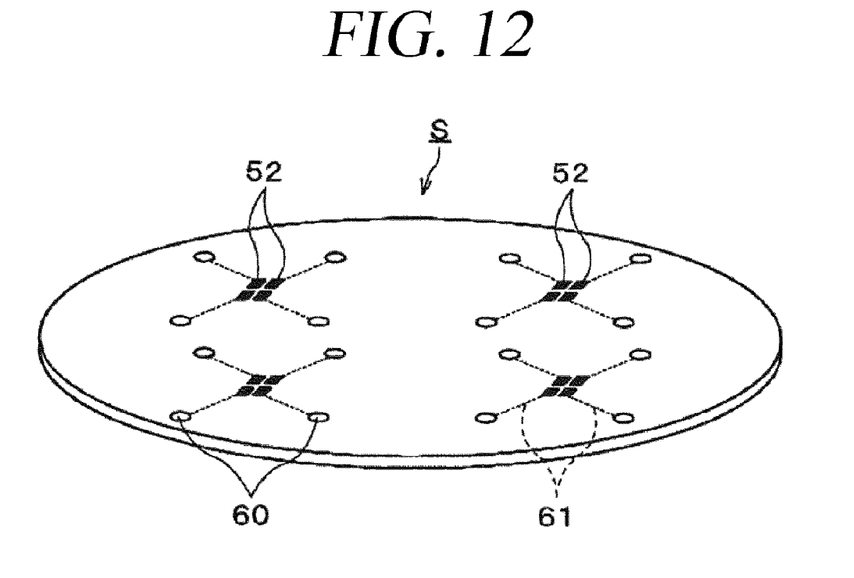
FIG. 12 offers a perspective view of the rear surface of the position detecting wafer on any place of which electrical conduction paths are arranged.

In the foregoing embodiments, the electrical conduction paths 60 are arranged annularly in the peripheral portion of the position detecting wafer S. However, for example, as illustrated in FIG. 12, it may be possible to arrange the electrical conductions paths 60 in any portions of the position detecting wafer S. For example, the electrostatic capacitance detecting electrodes 52 are placed in any place depending on the position of the reference object, in lieu of on the center portion of the rear surface of the position detecting wafer S column-wise and row-wise in a grid pattern as described in the foregoing embodiments. Further, the arrangement position of the devices such as the control circuit 51, the amplifier circuit 71, the wireless circuit 80 or the circuit board A on the front surface of the position detecting wafer S is not limited to the center portion of the front surface of the position detecting wafer S as described in the foregoing embodiments. In accordance with this embodiment, it may be possible to arrange the electrical conduction paths 60 in any place depending on the arrangement of the electrostatic capacitance detecting electrodes 52, the control circuit 51 or the like. Specifically, since it is possible to set the interval between the electrical conduction paths 60 to be greater than the interval between the neighboring electrostatic capacitance detecting electrodes 52, degree of freedom in arranging the electrical conduction paths 60 improves.

It may be possible to form a protective film made of an insulating material on the rear surface of the position detecting wafer S of the foregoing embodiments. The protective film is formed to cover the electrostatic capacitance detecting electrodes 52, the wirings 61 and the guard wirings 62 so as to prevent a possible metal contamination of the electrostatic capacitance detecting electrodes 52. Further, the electrostatic capacitance detecting electrodes 52 can be prevented from being damaged even if they are used many times.

In the foregoing embodiments, the components placed on the rear surface of the position detecting wafer S, such as the electrostatic capacitance detecting electrodes 52, the wirings 61 and the guard wirings 62 are formed by a photolithography process, but it may be possible to form such components by a screen printing process. Here, the screen printing process includes the steps of filling engraved pattern holes in a screen plate with ink, transcribing the engraved pattern into an imaging object and forming a certain pattern in the imaging object. In this embodiment, by using a screen plate formed with certain patterns corresponding to the electrostatic capacitance detecting electrodes 52, the wirings 61 and the guard wirings 62, the patterns are transcribed into the rear surface of the position detecting wafer S by using, e.g., silver ink or epoxy ink. After this process, the electrostatic capacitance detecting electrodes 52, the wirings 61 and the guard wirings 62 are formed on a certain place of the rear surface of the position detecting wafer S. By this screen printing process, it is possible to make the rear surface of the position detecting wafer S flat. Therefore, it becomes easier to horizontally maintain the position detecting wafer S by the transfer arm 20, so that it is possible to detect the position of the reference object more stably and accurately. By this screen printing process, it is possible to obtain substantially the same effects as obtained by the above-described embodiments using the photolithography process.

The above description of the present invention is provided for the purpose of illustration, and it would be understood by those skilled in the art that various changes and modifications may be made without changing technical conception and essential features of the present invention. Thus, it is clear that the above-described embodiments are illustrative in all aspects and do not limit the present invention.

For example, the number, the size, the shape or the position of the electrostatic capacitance detecting electrodes 52 on the rear surface of the position detecting wafer S can be properly selected depending on the reference object for position alignment. Further, the position or the number of the amplifier circuits 71 or the control circuit 51 on the front surface of the position detecting wafer S shall not be limited to the above-described examples. Furthermore, the position or the number of the electrical conduction paths 60 in the position detecting wafer S shall not be limited to the above-described examples, either. Also, the reference object is not limited to the central hole 42, and it may be any object as long as it has a prominence or a depression. In the above-described embodiment, though the position detected by the position detecting wafer S is a position on the horizontal plane, the position detecting wafer S may detect a vertical position as well. In addition, it may be possible to install any other circuits having other functions to adjust the position on the front surface of the position detecting wafer S. Furthermore, in the above-described embodiment, though the position detecting jig is of the wafer type, it may be of a substrate type having another shape, e.g., a rectangular shape.

The present invention has many advantages when it is used to properly perform the position alignment of the transfer point of the transfer arm even in an apparatus having a thin transfer port.

The scope of the present invention is defined by the following claims rather than by the detailed description of the embodiment. It shall be understood that all modifications and embodiments conceived from the meaning and scope of the claims and their equivalents are included in the scope of the present invention.

What is claimed is:

1. A position detecting jig for performing a position alignment of a transfer point of a transfer arm which holds and transfers a substrate, the jig comprising:
an external controller;
a substrate body transferable by the transfer arm; and
an electrostatic capacitance detecting sensor for detecting an electrostatic capacitance in relation with a reference object for the position alignment,
wherein the electrostatic capacitance detecting sensor includes:
a plurality of electrostatic capacitance detecting electrodes, each forming the electrostatic capacitance between the reference object and the electrostatic capacitance detecting electrode; and
a control circuit for controlling a detection of the electrostatic capacitance by each electrostatic capacitance detecting electrode, while communicating with each electrostatic capacitance detecting electrode,
wherein the electrostatic capacitance detecting electrodes are provided on a rear surface of the substrate body, and the control circuit is provided on a front surface of the substrate body, and
coordinates (x, y) of the reference object with respect to the substrate body is calculated by said external controller based on a preset relationship between electrostatic capacitance values of multiple electrostatic capacitance detecting electrodes and a position of the reference object with respect to the substrate body.

2. The position detecting jig of claim 1, wherein the substrate body is provided with a plurality of electrical conduction paths perforated from the rear surface to the front surface of the substrate body, and each electrostatic capacitance detecting electrode is connected to the control circuit through the electrical conduction paths.

3. The position detecting jig of claim 2, wherein the plurality of electrical conduction paths are formed in a peripheral portion of the substrate body.

4. The position detecting jig of claim 3, wherein the plurality of electrical conduction paths are arranged annularly in the peripheral portion of the substrate body, and
the electrostatic capacitance detecting electrodes are disposed in a central portion of the rear surface of the substrate body in comparison with the electrical conduction paths, and
wirings connecting the electrostatic capacitance detecting electrodes with the electrical conduction paths are formed in the rear surface of the substrate body in a radial pattern.

5. The position detecting jig of claim 1, wherein an amplifier circuit for amplifying a signal of the electrostatic capacitance detected by the electrostatic capacitance detecting electrode is provided on each wiring connecting each electrostatic capacitance detecting electrode with the control circuit, and the amplifier circuit is disposed on the front surface of the substrate body.

6. The position detecting jig of claim 5, wherein each wiring, connecting each electrostatic capacitance detecting electrode with the amplifier circuit, and each of the electrostatic capacitance detecting electrodes are covered with a guard wiring which can be maintained at the same potential as that of the wiring or the electrostatic capacitance detecting electrode.

7. The position detecting jig of claim 1, wherein the front surface of the substrate body is provided with a wireless circuit communicating between the external controller for performing the position alignment of the transfer arm and the control circuit.

8. The position detecting jig of claim 1, wherein the electrostatic capacitance detecting electrodes are also provided at a position supported by the transfer arm on the rear surface of the substrate body.

9. The position detecting jig of claim 1, wherein the electrostatic capacitance detecting electrodes are formed by a photolithography process.

10. The position detecting jig of claim 1, wherein the electrostatic capacitance electrodes are formed by a screen printing process.

11. The position detecting jig of claim 1, wherein disposed in the transfer point of the transfer arm is a rotation maintenance unit for holding and rotating the substrate body, and
   installed on a center portion of the front surface of the substrate body is an acceleration sensor for measuring acceleration in the center portion of the substrate body while the substrate body is being rotated by the rotation maintenance unit.

12. The position detecting jig of claim 1, wherein the front surface of the substrate body is provided with a humidity sensor for measuring humidity of an atmosphere around the substrate body.

13. The position detecting jig of claim 1, wherein the front surface of the substrate body is provided with a temperature sensor for measuring temperature of an atmosphere around the substrate body.

* * * * *